United States Patent
Lee et al.

(10) Patent No.: US 9,326,381 B2
(45) Date of Patent: Apr. 26, 2016

(54) MULTILAYER CERAMIC CAPACITOR AND BOARD HAVING THE SAME MOUNTED THEREON

(71) Applicant: SAMSUNG ELECTRO-MECHANICS CO., LTD., Suwon-Si, Gyeonggi-Do (KR)

(72) Inventors: Byoung Hwa Lee, Suwon-Si (KR); Heung Kil Park, Suwon-Si (KR); Kyo Kwang Lee, Suwon-Si (KR); Young Ghyu Ahn, Suwon-Si (KR); Sang Soo Park, Suwon-Si (KR); Soon Ju Lee, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 197 days.

(21) Appl. No.: 14/259,011

(22) Filed: Apr. 22, 2014

(65) Prior Publication Data

US 2014/0367152 A1    Dec. 18, 2014

(30) Foreign Application Priority Data

Jun. 14, 2013   (KR) .................. 10-2013-0068498

(51) Int. Cl.
*H01G 4/30* (2006.01)
*H05K 1/11* (2006.01)
(Continued)

(52) U.S. Cl.
CPC ............. *H05K 1/111* (2013.01); *H01G 4/1209* (2013.01); *H01G 4/232* (2013.01); *H01G 4/30* (2013.01);
(Continued)

(58) Field of Classification Search
CPC ............. H01G 4/30; H01G 4/06; H01G 4/12; H01G 4/005; H01G 4/008
USPC ................ 361/301.4, 303–305, 306.1, 306.3, 361/321.1, 321.2
See application file for complete search history.

(56) References Cited

U.S. PATENT DOCUMENTS 5,134,540 A † 7/1992 Rutt
5,952,040 A † 9/1999 Yadav
(Continued)

FOREIGN PATENT DOCUMENTS

| JP | 2008-192757 A | 8/2008 |
|---|---|---|
| KR | 10-2008-0063680 A | 7/2008 |
| KR | 10-2008-0110180 A | 12/2008 |

OTHER PUBLICATIONS

Yukio Sakabe et al.; High Frequency Performance of Multilayer Ceramic Capacitors, Document No. 0569-5503/95/0000, pp. 234-240, 1995 IEEE.†

(Continued)

*Primary Examiner* — Nguyen T Ha
(74) *Attorney, Agent, or Firm* — McDermott Will & Emery LLP

(57) ABSTRACT

A multilayer ceramic capacitor may include: a ceramic body including dielectric layers and having first and second main surfaces opposing each other, first and second side surfaces opposing each other, and first and second end surfaces opposing each other; an active layer configured to form capacitance by including first and second internal electrodes facing each other with one dielectric layer therebetween and alternately exposed to the first or second side surface; upper and lower cover layers disposed on and below the active layer; and a first external electrode disposed on the first side surface and a second external electrode disposed on the second side surface. Thickness T and width W of the ceramic body satisfy $0.75W \le T \le 1.25W$, gap G between the first and second external electrodes satisfies $30\ \mu m \le G \le 0.9W$, and an average number of dielectric grains in a single dielectric layer in a thickness direction thereof is 2 or greater.

19 Claims, 5 Drawing Sheets

(51) Int. Cl.
*H01G 4/232* (2006.01)
*H05K 3/34* (2006.01)
*H01G 4/12* (2006.01)

(52) U.S. Cl.
CPC ............. *H01G 4/12* (2013.01); *H05K 3/3442* (2013.01); *H05K 2201/0979* (2013.01); *H05K 2201/09709* (2013.01); *H05K 2201/10015* (2013.01); *H05K 2201/2045* (2013.01); *Y02P 70/611* (2015.11)

(56) References Cited

U.S. PATENT DOCUMENTS

| | | | | |
|---|---|---|---|---|
| 6,377,439 | B1 * | 4/2002 | Sekidou | H01G 4/005 361/303 |
| 7,414,857 | B2 † | 8/2008 | Ritter | |
| 8,238,116 | B2 † | 8/2012 | Eggerding | |
| 8,263,515 | B2 * | 9/2012 | Dogan | B82Y 30/00 501/127 |
| 8,383,535 | B2 * | 2/2013 | Yamaguchi | C04B 35/46 361/321.4 |
| 8,437,115 | B2 * | 5/2013 | Kim | H01G 4/30 361/305 |
| 8,737,037 | B2 * | 5/2014 | Kim | H01G 4/0085 361/305 |
| 9,009,240 | B2 * | 4/2015 | Milic-Frayling | G06Q 10/10 370/432 |
| 9,129,750 | B2 * | 9/2015 | Kim | H01G 4/1209 |
| 2008/0310074 | A1 | 12/2008 | Togashi et al. | |
| 2008/0310078 | A1 | 12/2008 | Lee et al. | |

OTHER PUBLICATIONS

Joseph M. Hock et al.; TecForum TF-MP2, Inductance of Bypass Capacitors How to Define, How to Measure, How to Simulate, DesignCon East 2005.†

\* cited by examiner
† cited by third party

A–A'

Z

MULTILAYER CERAMIC CAPACITOR AND BOARD HAVING THE SAME MOUNTED THEREON

CROSS-REFERENCE TO RELATED APPLICATION

This application claims the benefit of Korean Patent Application No. 10-2013-0068498 filed on Jun. 14, 2013, with the Korean Intellectual Property Office, the disclosure of which is incorporated herein by reference.

BACKGROUND

The present disclosure relates to a multilayer ceramic capacitor and a board having the same mounted thereon.

In accordance with the recent trend toward miniaturization and high capacitance of electronic products, electronic components used in the electronic products are required to have a small size and high capacitance. Therefore, a demand for a multilayer ceramic electronic component has been increased.

In the case of a multilayer ceramic capacitor, as equivalent series inductance (hereinafter, referred to as "ESL") increases, performance of an electronic product may deteriorate. In addition, in a case in which an electronic component is miniaturized and capacitance thereof is increased, the influence of an increase in ESL on deterioration in performance of the electronic product has relatively increased.

A so-called "low inductance chip capacitor (LICC)" is to decrease inductance by decreasing a distance between external terminals to shorten a current flow path.

Meanwhile, the multilayer ceramic capacitor may have a structure in which a plurality of dielectric layers and internal electrodes having opposite polarities and having at least one of the dielectric layers interposed therebetween are alternately stacked.

Since the dielectric layers have piezoelectric and electrostrictive properties, when direct current (DC) or alternating current (AC) voltage is applied to the multilayer ceramic capacitor, a piezoelectric phenomenon may occur between the internal electrodes, causing vibrations.

Such vibrations may be transferred to a printed circuit board on which the multilayer ceramic capacitor is mounted through a solder, such that the entire printed circuit board may become an acoustic reflection surface to transmit the sound of vibrations as noise.

Vibration noise may have a frequency corresponding to an audio frequency within a range of 20 to 20000 Hz, potentially causing listener discomfort. The vibration noise causing listener discomfort, as described above, is known as acoustic noise.

Research into a technology of reducing the acoustic noise in a multilayer ceramic capacitor is still demanded.

SUMMARY

An aspect of the present disclosure may provide a multilayer ceramic capacitor and a board having the same mounted thereon.

According to an aspect of the present disclosure, a multilayer ceramic capacitor may include: a ceramic body including dielectric layers and having first and second main surfaces opposing each other, first and second side surfaces opposing each other, and first and second end surfaces opposing each other; an active layer configured to form capacitance by including a plurality of first and second internal electrodes disposed to face each other with at least one of the dielectric layers interposed therebetween and alternately exposed to the first or second side surface; upper and lower cover layers disposed on and below the active layer, respectively; and a first external electrode disposed on the first side surface of the ceramic body and electrically connected to the first internal electrodes and a second external electrode disposed on the second side surface and electrically connected to the second internal electrodes, wherein when a thickness of the ceramic body is defined as T and a width thereof is defined as W, $0.75W \leq T \leq 1.25W$ may be satisfied, when a gap between the first and second external electrodes is defined as G, $30\ \mu m \leq G \leq 0.9W$ may be satisfied, and an average number of dielectric grains in a single dielectric layer in a thickness direction thereof may be 2 or greater.

The lower cover layer may have a thickness of 10 μm to 100 μm.

When the thickness of the ceramic body is a distance between the first and second main surfaces, the width of the ceramic body is a distance between the first side surface on which the first external electrode is formed and the second side surface on which the second external electrode is formed, and a length of the ceramic body is a distance between the first and second end surfaces, the distance between the first and second side surfaces may be shorter than or equal to the distance between the first and second end surfaces.

When the length and the width of the ceramic body are defined as L and W, respectively, $0.5L \leq W \leq L$ may be satisfied.

An average grain size of the dielectric grains may be 50 nm to 500 nm.

The first and second internal electrodes may be spaced apart from the first and second end surfaces of the ceramic body by a predetermined distance.

The first and second external electrodes may be extended to portions of the first and second main surfaces of the ceramic body.

According to another aspect of the present disclosure, a board having a multilayer ceramic capacitor mounted thereon may include: a printed circuit board having two or more electrode pads formed thereon; the multilayer ceramic capacitor mounted on the printed circuit board; and a solder connecting the electrode pads and the multilayer ceramic capacitor, wherein the multilayer ceramic capacitor may include: a ceramic body including dielectric layers and having first and second main surfaces opposing each other, first and second side surfaces opposing each other, and first and second end surfaces opposing each other; an active layer configured to form capacitance by including a plurality of first and second internal electrodes disposed to face each other with at least one of the dielectric layers interposed therebetween and alternately exposed to the first or second side surface; upper and lower cover layers disposed on and below the active layer, respectively; and a first external electrode disposed on the first side surface of the ceramic body and electrically connected to the first internal electrodes and a second external electrode disposed on the second side surface and electrically connected to the second internal electrodes, wherein when a thickness of the ceramic body is defined as T and a width thereof is defined as W, $0.75W \leq T \leq 1.25W$ may be satisfied, when a gap between the first and second external electrodes is defined as G, $30\ \mu m \leq G \leq 0.9W$ may be satisfied, and an average number of dielectric grains in a single dielectric layer in a thickness direction thereof may be 2 or greater.

The lower cover layer may have a thickness of 10 μm to 100 μm.

When the thickness of the ceramic body is a distance between the first and second main surfaces, the width of the ceramic body is a distance between the first side surface on which the first external electrode is formed and the second side surface on which the second external electrode is formed, and a length of the ceramic body is a distance between the first and second end surfaces, the distance between the first and second side surfaces may be shorter than or equal to the distance between the first and second end surfaces.

When the length and the width of the ceramic body are defined as L and W, respectively, $0.5L \le W \le L$ may be satisfied.

An average grain size of the dielectric grains may be 50 nm to 500 nm.

The first and second internal electrodes may be spaced apart from the first and second end surfaces of the ceramic body by a predetermined distance.

The first and second external electrodes may be extended to portions of the first and second main surfaces of the ceramic body.

The solder may be disposed around portions of the first and second external electrodes of the multilayer ceramic capacitor.

The solder may be disposed around central portions of the first and second external electrodes of the multilayer ceramic capacitor.

The electrode pads may include first and second electrode pads connected to the first and second external electrodes of the multilayer ceramic capacitor, respectively.

The first and second electrode pads may be offset to each other in a width direction of the multilayer ceramic capacitor.

The electrode pads may include first and second electrode pads connected to the first external electrode of the multilayer ceramic capacitor and third and fourth electrode pads connected to the second external electrode of the multilayer ceramic capacitor.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
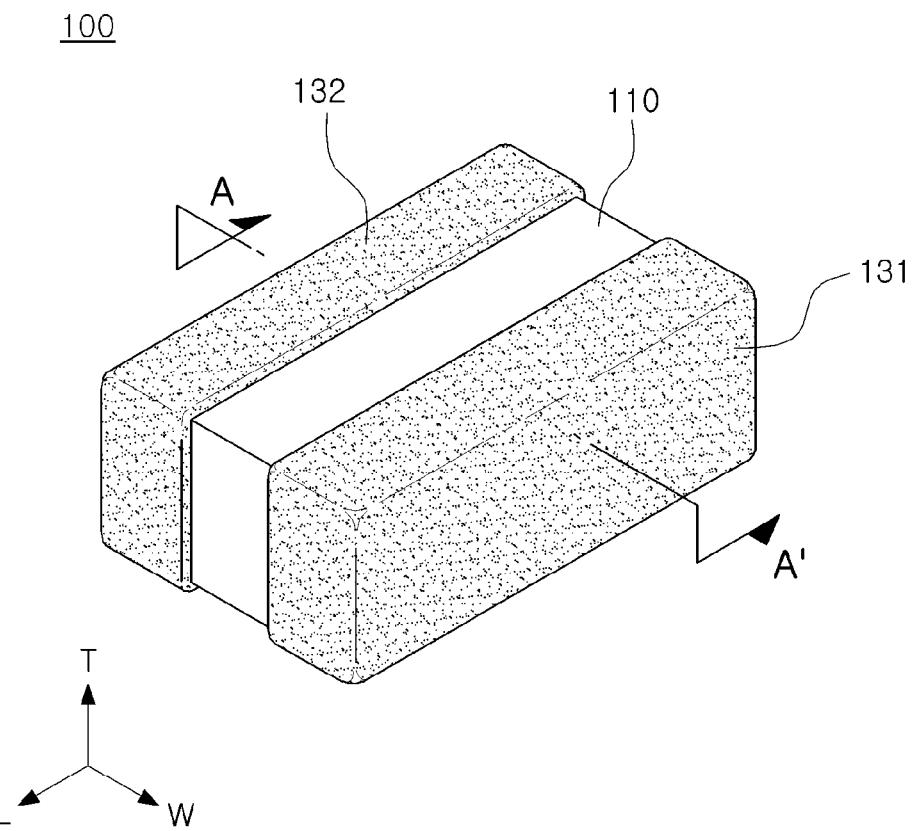
FIG. 1 is a perspective view showing a multilayer ceramic capacitor according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Capacitor

FIG. 1 is a perspective view showing a multilayer ceramic capacitor according to an exemplary embodiment of the present disclosure.

Figure 2:
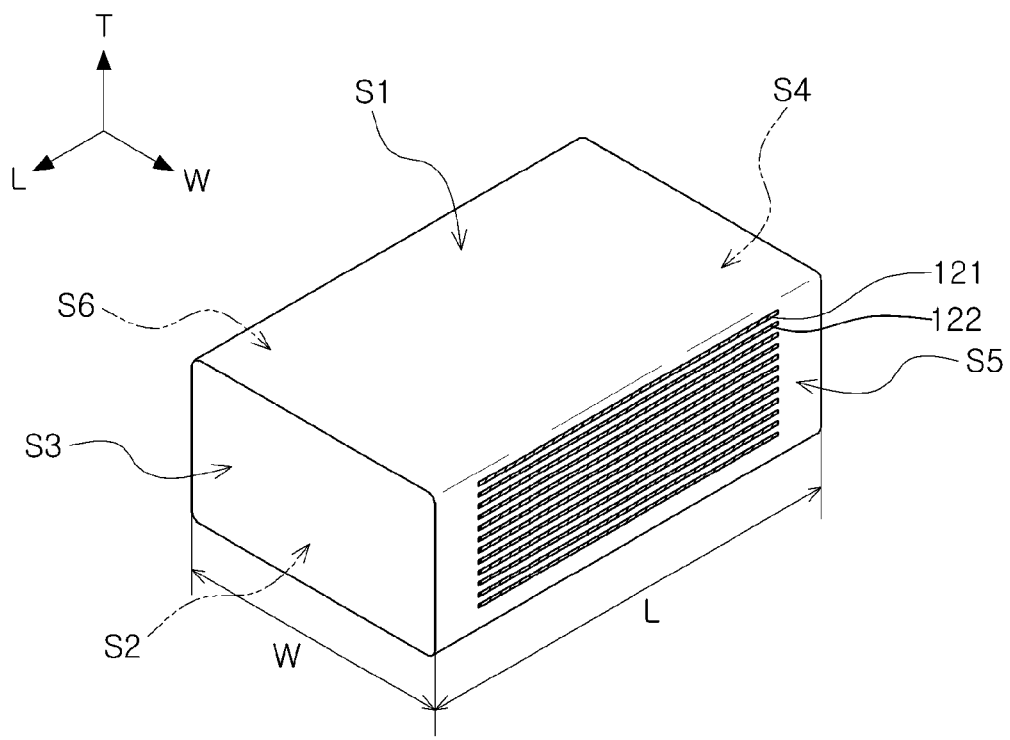
FIG. 2 is a view showing a ceramic body according to an exemplary embodiment of the present disclosure.

FIG. 2 is a view showing a ceramic body according to an exemplary embodiment of the present disclosure.

Figure 3:
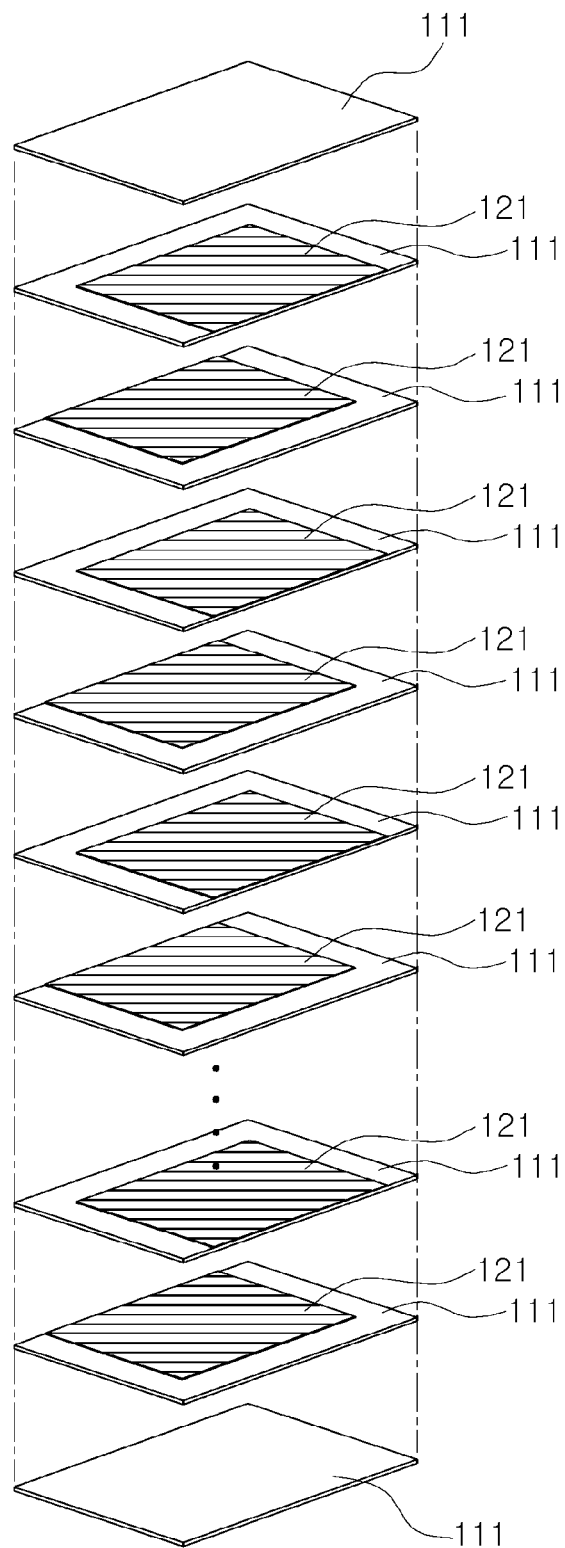
FIG. 3 is an exploded perspective view of FIG. 2.

FIG. 3 is an exploded perspective view of FIG. 2.

Figure 4:
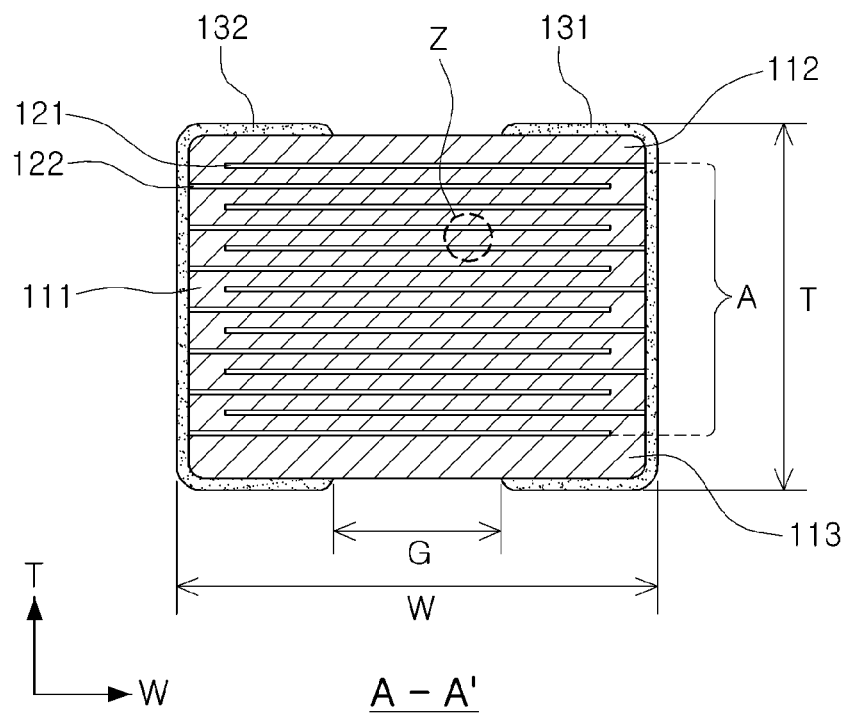
FIG. 4 is a cross-sectional view taken along line A-A' of FIG. 1.

FIG. 4 is a cross-sectional view taken along line A-A' of FIG. 1.

Referring to FIGS. 1 through 4, a multilayer ceramic capacitor 100 according to an exemplary embodiment of the present disclosure may include a ceramic body 110 including dielectric layers 111 and having first and second main surfaces S1 and S2 opposing each other, first and second side surfaces S5 and S6 opposing each other, and first and second end surfaces S3 and S4 opposing each other; an active layer A configured to form capacitance by including a plurality of first and second internal electrodes 121 and 122 disposed to face each other, having at least one of the dielectric layers 111 interposed therebetween, and alternately exposed to the first or second side surface S5 or S6; upper and lower cover layers 112 and 113 formed on and below the active layer A; and a first external electrode 131 formed on the first side surface S5 of the ceramic body 110 and electrically connected to the first internal electrode 121 and a second external electrode 132 formed on the second side surface S6 and electrically connected to the second internal electrode 122, wherein when a thickness of the ceramic body 110 is defined as T and a width thereof is defined as W, T and W satisfy $0.75W \le T \le 1.25W$, when a gap between the first and second external electrodes 131 and 132 is defined as G, the gap G satisfies $30\ \mu m \le G \le 0.9W$, and the average number of dielectric grains 111a present in a single dielectric layer in a thickness direction thereof is 2 or greater.

Hereinafter, a multilayer ceramic electronic component according to an exemplary embodiment of the present disclosure will be described. Particularly, a multilayer ceramic capacitor will be described, but the present disclosure is not limited thereto.

Referring to FIG. 1, in the multilayer ceramic capacitor according to an exemplary embodiment of the present disclosure, a 'length direction' refers to an 'L' direction, a 'width direction' refers to a 'W' direction, and a 'thickness direction' refers to a 'T' direction. Here, the 'thickness direction' may be the same as a stacking direction in which dielectric layers are stacked.

Referring to FIG. 2, in the exemplary embodiment of the present disclosure, the ceramic body 110 may have the first and second main surfaces S1 and S2 opposing each other, and the first and second side surfaces S5 and S6 and the first and second end surfaces S3 and S4 that connect the first and second main surfaces S1 and S2 to each other. A shape of the ceramic body 110 is not particularly limited, but may be a hexahedral shape as shown.

Referring to FIG. 3, a raw material forming the dielectric layers 111 is not particularly limited as long as sufficient capacitance may be obtained, but may be, for example, barium titanate ($BaTiO_3$) powder.

The material forming the dielectric layer 111 may further contain various ceramic additives, organic solvents, plasticizers, binders, dispersing agents, or the like, according to intended use of the capacitor, in addition to ceramic powder such as barium titanate ($BaTiO_3$) powder, or the like.

An average particle size of the ceramic powder used to form the dielectric layers 111 is not particularly limited and may be controlled, for example, to be 400 nm or less.

A material for the first and second internal electrodes 121 and 122 is not particularly limited. For example, the first and second internal electrodes 121 and 122 may be formed of a conductive paste including at least one of a noble metal material such as palladium (Pd), a palladium-silver (Pd—Ag) alloy, or the like, nickel (Ni), and copper (Cu).

The first and second internal electrodes 121 and 122 may be disposed to face each other, having at least one of the dielectric layers 111 interposed therebetween, and may be alternately exposed to the first or second side surface S5 or S6.

The first and second internal electrodes 121 and 122 are alternately exposed to the first or second side surface S5 or S6, such that a reverse geometry capacitor (RGC) or low inductance chip capacitor (LICC) may be obtained as described below.

In a general multilayer ceramic electronic component, external electrodes may be disposed on opposing end surfaces of the ceramic body in a length direction thereof.

In this case, when an alternative current (AC) voltage is applied to the external electrodes, a current path is relatively long, whereby an intensity of an induced magnetic field may be increased, resulting in an increase in inductance.

In order to solve this problem, the first and second external electrodes 131 and 132 in the exemplary embodiment of the present disclosure may be disposed on the first and second side surfaces S5 and S6 of the ceramic body 110 opposing each other in the width direction so as to reduce the current path.

In this case, since a distance between the first and second external electrodes 131 and 132 is relatively short, the current path may be reduced, the current path may be reduced, resulting in a reduction in inductance.

As described above, the first and second external electrodes 131 and 132 may be formed on the first and second side surfaces S5 and S6 of the ceramic body 110 opposing each other in the width direction and may be electrically connected to the first and second internal electrodes 121 and 122 in order to form capacitance.

The first and second external electrodes 131 and 132 may be formed of the same conductive material as that of the first and second internal electrodes 121 and 122 but are not limited thereto. For example, the first and second external electrodes 131 and 132 may be formed of a metal powder including copper (Cu), silver (Ag), nickel (Ni), or the like.

The first and second external electrodes 131 and 132 may be formed by applying a conductive paste prepared by adding glass frits to the metal powder and then sintering the applied conductive paste.

A width W of the ceramic body 110 may be a distance between the first side surface S5 on which the first external electrode 131 is formed and the second side surface S6 on which the second external electrode 132 is formed, and a length L of the ceramic body 110 may be a distance between the first and second end surfaces S3 and S4.

According to the exemplary embodiment of the present disclosure, the distance between the first and second side surfaces 5 and 6 on which the first and second external electrodes 131 and 132 are formed, respectively, may be less than or equal to the distance between the first and second end surfaces 3 and 4.

Since the distance between the first and second external electrodes 131 and 132 is shortened, the current path may be shortened, resulting in a reduction in inductance.

As described above, the multilayer ceramic capacitor, in which the first and second external electrodes 131 and 132 are formed on the first and second side surfaces 5 and 6 of the ceramic body 110, may be a reverse geometry capacitor (RGC) or low inductance chip capacitor (LICC).

Referring to FIG. 4, the ceramic body 110 may include the active layer A contributing to forming capacitance of the capacitor and the upper and lower cover layers 112 and 113 formed on and below the active layer A, respectively, as upper and lower margin parts.

The active layer A may be formed by repeatedly stacking the plurality of first and second internal electrodes 121 and 122, having at least one of the dielectric layers 111 interposed therebetween.

Meanwhile, in the multilayer ceramic capacitor according to the exemplary embodiment of the present disclosure, when the thickness and the width of the ceramic body 110 are defined as T and W, respectively, $0.75W \leq T \leq 1.25W$ may be satisfied.

Acoustic noise may be reduced by controlling the thickness T and the width W of the ceramic body 110 to satisfy $0.75W \leq T \leq 1.25W$.

In the case in which the thickness T of the ceramic body is less than 0.75W, target capacitance may not be generated in the multilayer ceramic capacitor.

In the case in which the thickness T of the ceramic body 110 is greater than 1.25W, the multilayer ceramic capacitor may be inclined when being mounted on a board, whereby a mounting defect may occur.

Meanwhile, when the gap between the first and second external electrodes 131 and 132 is defined as G, $30 \mu m \leq G \leq 0.9W$ may be satisfied.

Acoustic noise may be reduced by controlling the gap G between the first and second external electrodes 131 and 132 to satisfy $30 \mu m \leq G \leq 0.9W$.

In the case in which the gap G between the first and second external electrodes 131 and 132 is less than 30 µm, the G between the first and second external electrodes 131 and 132 is excessively narrow, such that a short circuit may occur.

In the case in which the gap G between the first and second external electrodes 131 and 132 is greater than 0.9W, a width of the first and second external electrodes 131 and 132 may be reduced to thereby reduce a mounting area when being mounted on the board, causing a defect resulting from poor adhesive strength.

Further, when the length and width of the ceramic body 110 are defined as L and W, respectively, $0.5L \leq W \leq L$ may be satisfied. However, the present disclosure is not limited thereto.

Inductance of the multilayer ceramic capacitor may be reduced by controlling the length and the width of the ceramic body to satisfy $0.5L \leq W \leq L$.

Therefore, low inductance may be implemented in the multilayer ceramic electronic component according to the exemplary embodiment of the present disclosure, whereby electric performance may be improved.

Meanwhile, according to the exemplary embodiment of the present disclosure, the thickness of the lower cover layer 113 may be 10 µm to 100 µm.

When the thickness of the lower cover layer 113 is controlled to be 10 µm to 100 µm, acoustic noise may be reduced and excellent reliability may be implemented in the multilayer ceramic capacitor.

In the case in which the thickness of the lower cover layer 113 is less than 10 μm, such an excessively thin cover layer may result in the occurrence of a moisture resistance defect.

In the case in which the thickness of the lower cover layer 113 is greater than 100 μm, acoustic noise may be rapidly increased due to displacement of the lower cover layer.

A thickness of the upper cover layer 112 is not particularly limited, and may be equal to or similar to that of the lower cover layer 113. The thickness of the upper cover layer 112 may be within a range preventing the occurrence of the moisture resistance defect.

Figure 5:
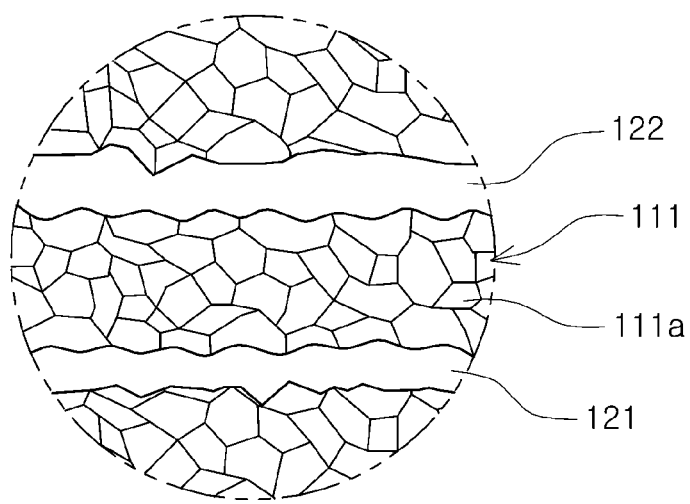
FIG. 5 is an enlarged view of part Z of FIG. 4.

FIG. 5 is an enlarged view of part Z of FIG. 4.

Referring to FIG. 5, the average number of dielectric grains 111a present in a single dielectric layer 111 in a thickness direction thereof may be 2 or greater.

Acoustic noise may be reduced by controlling the average number of dielectric grains 111a present in the single dielectric layer in the thickness direction thereof to be 2 or greater.

In the case in which the average number of dielectric grains 111a in the single dielectric layer 111 in the thickness direction thereof is less than 2, the number of grain boundaries is reduced, and when voltage is applied to the internal electrodes, a displacement of the dielectric layer may be increased, resulting in an increase in a displacement of the multilayer ceramic capacitor, whereby acoustic noise may be increased.

Meanwhile, an average grain size of the dielectric grains 111a may be 50 nm to 500 nm.

Acoustic noise may be reduced by controlling the average grain size of the dielectric grains 111a to be 50 nm to 500 nm.

In the case in which the average grain size of the dielectric grains 111a is less than 50 nm, such an excessively small grain size may cause a reduction in permittivity, whereby target capacitance of the multilayer ceramic capacitor required by a power terminal may not be generated.

In the case in which the average grain size of the dielectric grains 111a is greater than 500 nm, such an excessively large grain size may increase a region in which a single dielectric grain occupies in a single dielectric layer, whereby acoustic noise may be increased.

A method of measuring the average number of the dielectric grains 111a in the single dielectric layer in the thickness direction thereof and the average grain size of the dielectric grains 111a is not particularly limited, but the average number and the average grain size of the dielectric grains 111a may be measured from an image obtained by scanning a cross-section of the ceramic body 110 in the width direction thereof using a scanning electron microscope (SEM) as shown in FIG. 4.

For example, as shown in FIG. 4, with respect to any dielectric layer randomly selected from an image obtained by scanning a cross-section of the ceramic body 10 in width-thickness (W-T) directions thereof after being cut in a central portion of the ceramic body 10 in the length (L) direction thereof, using a scanning electron microscope (SEM), the average number of the dielectric grains 111a in the single dielectric layer and the average grain size of the dielectric grains 11a may be measured at thirty equidistant points thereof.

The thirty equidistant points may be disposed in the active layer A, in which the internal electrodes 121 and 122 are overlapped with each other.

The first and second internal electrodes 121 and 122 may be spaced part from the first and second end surfaces S3 and S4 of the ceramic body 110 by a predetermined distance, but are not limited thereto.

Meanwhile, the first and second external electrodes 131 and 132 may be extended to portions of the first and second main surfaces S1 and S2 of the ceramic body, but are not limited thereto.

Hereinafter, a method of manufacturing a multilayer ceramic capacitor according to an exemplary embodiment of the present disclosure will be described, but is not limited thereto.

In the method of manufacturing the multilayer ceramic capacitor according to the exemplary embodiment of the present disclosure, first, slurry containing powder such as barium titanate ($BaTiO_3$) powder, or the like, may be applied to carrier films and dried to prepare a plurality of ceramic green sheets, thereby forming dielectric layers.

The ceramic green sheet may be manufactured by mixing the ceramic powder, a binder, and a solvent to prepare the slurry and forming the prepared slurry as sheets having a thickness of several μm by a doctor blade method.

Next, a conductive paste for internal electrodes may be prepared to contain 40 to 50 parts by weight of nickel powder, in which an average particle size of nickel powder is 0.1 μm to 0.2 μm.

After the conductive paste for internal electrodes is applied to the green sheets through a screen printing method to form internal electrodes, 400 to 500 green sheets on which the internal electrodes have been formed may be stacked to form an active layer, and then the ceramic green sheets may be stacked on and below the active layer to form cover layers, thereby forming a ceramic body having first and second main surfaces opposing each other, first and second side surfaces opposing each other, and first and second end surfaces opposing each other.

Then, first and second external electrodes may be formed on the first and second side surfaces of the ceramic body.

Hereafter, although the present disclosure will be described in detail with reference to Inventive Examples, the present inventive concept is not limited thereto.

EXPERIMENTAL EXAMPLE

Multilayer ceramic capacitors according to Inventive Examples and Comparative Examples were manufactured as follows.

Slurry containing powder such as barium titanate ($BaTiO_3$), or the like, was applied to carrier films and dried to prepare a plurality of ceramic green sheets having a thickness of 1.8 μm.

Next, a nickel conductive paste for internal electrodes was applied to the ceramic green sheets using a screen to form internal electrodes.

About 200 ceramic green sheets were stacked to form a multilayer body. Here, the number of ceramic green sheets having no internal electrode disposed at a lower portion of the multilayer body below the stacked ceramic green sheets having the internal electrodes formed thereon was greater than the number of ceramic green sheets having no internal electrode disposed at an upper portion of the multilayer body above the stacked ceramic green sheets having the internal electrodes formed thereon. Isostatic pressing was performed on the multilayer body at 85° C. and 1000 $kgf/cm^2$.

The pressed ceramic multilayer body was cut into individual chips, and each chip was subjected to a de-binding process by being maintained at 230° C. for 60 hours under air atmosphere.

Then, the chip was sintered at 1200° C. under reduction atmosphere having oxygen partial pressure of $10^{-11}$ atm to $10^{-10}$ atm lower than Ni—NiO equilibrium oxygen partial pressure so that the internal electrodes were not oxidized. After sintering, a size of the multilayer chip capacitor was about 1.0 mm×0.5 mm (Length×Width (L×W), 1005 size). Here, a manufacturing tolerance was within a range of ±0.1 mm (Length×Width (L×W)), and experiments were performed on samples satisfying such a tolerance range to test acoustic noise, moisture resistance, mounting defects and adhesion strength of each sample.

The following Tables 1 through 3 shows an acoustic noise measurement value, the occurrence of moisture resistance defects, and the occurrence of mounting defects according to a ratio (T/W) of a thickness T to a width W of the multilayer ceramic capacitor and a thickness of a lower cover layer.

Here, the experiments were performed in a state in which the average number of dielectric grains in a single dielectric layer in a thickness direction thereof was about 2.

TABLE 1

| T/W | THICKNESS OF LOW COVER LAYER [μm] | ACOUSTIC NOISE [dB] | MOISTURE RESISTANCE DEFECT | MOUNTING DEFECT |
|---|---|---|---|---|
| 1.0 | 5 | 21.5 | X | ⊚ |
| | 10 | 22.6 | ○ | ⊚ |
| | 20 | 23.1 | ⊚ | ⊚ |
| | 30 | 23.7 | ⊚ | ⊚ |
| | 40 | 23.8 | ⊚ | ⊚ |
| | 50 | 24.2 | ⊚ | ⊚ |
| | 60 | 25.3 | ⊚ | ⊚ |
| | 70 | 26.1 | ⊚ | ⊚ |
| | 80 | 26.6 | ⊚ | ⊚ |
| | 90 | 26.9 | ⊚ | ⊚ |
| | 100 | 27.6 | ⊚ | ⊚ |
| | 120 | 33.2 | ⊚ | ⊚ |
| | 150 | 36.4 | ⊚ | ⊚ |

X: Defect Rate of 50% or greater
Δ: Defect Rate of 1% to 50%
○: Defect Rate of 0.01% to 1%
⊚: Defect Rate less than 0.01%

TABLE 2

| T/W | THICKNESS OF LOW COVER LAYER [μm] | ACOUSTIC NOISE [dB] | MOISTURE RESISTANCE DEFECT | MOUNTING DEFECT |
|---|---|---|---|---|
| 1.25 | 5 | 20.7 | X | ⊚ |
| | 10 | 21.4 | ○ | ⊚ |
| | 20 | 22.5 | ⊚ | ⊚ |
| | 30 | 22.9 | ⊚ | ⊚ |
| | 40 | 22.9 | ⊚ | ⊚ |
| | 50 | 23.9 | ⊚ | ⊚ |
| | 60 | 24.2 | ⊚ | ⊚ |
| | 70 | 25.7 | ⊚ | ⊚ |
| | 80 | 25.9 | ⊚ | ⊚ |
| | 90 | 26.2 | ⊚ | ⊚ |
| | 100 | 27.9 | ⊚ | ⊚ |
| | 120 | 33.4 | ⊚ | ⊚ |
| | 150 | 34.1 | ⊚ | ⊚ |

X: Defect Rate of 50% or greater
Δ: Defect Rate of 1% to 50%
○: Defect Rate of 0.01% to 1%
⊚: Defect Rate less than 0.01%

TABLE 3

| T/W | THICKNESS OF LOW COVER LAYER [μm] | ACOUSTIC NOISE [dB] | MOISTURE RESISTANCE DEFECT | MOUNTING DEFECT |
|---|---|---|---|---|
| 1.30 | 5 | 20.4 | X | X |
| | 10 | 21.5 | ○ | X |
| | 20 | 22.7 | ⊚ | X |
| | 30 | 23.1 | ⊚ | X |
| | 40 | 23.7 | ⊚ | X |
| | 50 | 24.5 | ⊚ | X |
| | 60 | 24.9 | ⊚ | X |
| | 70 | 25.2 | ⊚ | X |
| | 80 | 25.6 | ⊚ | X |
| | 90 | 25.9 | ⊚ | X |
| | 100 | 27.7 | ⊚ | X |
| | 120 | 33.7 | ⊚ | X |
| | 150 | 36.1 | ⊚ | X |

X: Defect Rate of 50% or greater
Δ: Defect Rate of 1% to 50%
○: Defect Rate of 0.01% to 1%
⊚: Defect Rate less than 0.01%

Referring to Tables 1 through 3, it can be seen that in the case in which the thickness T and the width W of the ceramic body satisfied $0.75W \leq T \leq 1.25W$, acoustic noise was reduced.

Particularly, it can be seen from Table 3 that in the case in which the thickness T of the ceramic body was 1.30W, the mounting defect that the multilayer ceramic capacitor was inclined when being mounted on a board occurred.

Further, referring to Tables 1 through 3, it can be seen that in the case in which the thickness of the lower cover layer was 10 μm to 100 μm, acoustic noise was reduced and reliability was excellent.

It can be seen that in the case in which the thickness of the lower cover layer was 5 μm, which was out of the above-mentioned numerical range, there was a problem in reliability due to the moisture resistance defect, and in the cases in which the thickness of the lower cover layer was 120 μm or 150 μm, acoustic noise was increased.

The following Tables 4 shows an acoustic noise measurement value, the occurrence of moisture resistance defects, and the occurrence of mounting defects according to a ratio (T/W) of a thickness T to a width W of a multilayer ceramic capacitor and a thickness of a lower cover layer, in the case in which the average number of dielectric grains in a single dielectric layer in a thickness direction thereof was less than

TABLE 4

| T/W | THICKNESS OF LOW COVER LAYER [μm] | ACOUSTIC NOISE [dB] | MOISTURE RESISTANCE DEFECT | MOUNTING DEFECT |
|---|---|---|---|---|
| 1.0 | 5 | 26.7 | X | ⊚ |
| | 10 | 27.1 | ○ | ⊚ |
| | 20 | 27.7 | ⊚ | ⊚ |
| | 30 | 28.5 | ⊚ | ⊚ |
| | 40 | 28.8 | ⊚ | ⊚ |
| | 50 | 29.1 | ⊚ | ⊚ |
| | 60 | 30.6 | ⊚ | ⊚ |
| | 70 | 31.3 | ⊚ | ⊚ |
| | 80 | 31.6 | ⊚ | ⊚ |
| | 90 | 32.3 | ⊚ | ⊚ |
| | 100 | 32.5 | ⊚ | ⊚ |

TABLE 4-continued

| T/W | THICKNESS OF LOW COVER LAYER [μm] | ACOUSTIC NOISE [dB] | MOISTURE RESISTANCE DEFECT | MOUNTING DEFECT |
|---|---|---|---|---|
| | 120 | 38.1 | ◉ | ◉ |
| | 150 | 40.0 | ◉ | ◉ |

X: Defect Rate of 50% or greater
Δ: Defect Rate of 1% to 50%
○: Defect Rate of 0.01% to 1%
◉: Defect Rate less than 0.01%

Referring to Table 4, it can be seen that in the case in which the average number of the dielectric grains 111a in a single dielectric layer in the thickness direction thereof was less than 2, the number of grain boundaries was reduced, and when voltage was applied to the internal electrodes, a displacement of the dielectric layer was increased, resulting in an increase in a displacement of the multilayer ceramic capacitor, whereby acoustic noise was increased.

The following Table 5 shows an acoustic noise measurement value, and the occurrence of mounting defects and adhesion strength defect according to the width W of the multilayer ceramic capacitor and a gap G between first and second external electrodes.

TABLE 5

| W [μm] | GAP(G) BETWEEN EXTERNAL ELECTRODES | G/W | ACOUSTIC NOISE [dB] | MOUNTING DEFECT (SHORT) | ADHESION STRENGTH |
|---|---|---|---|---|---|
| 650 | 25 | 0.04 | 21.7 | X | ◉ |
| 650 | 30 | 0.05 | 22.0 | ○ | ◉ |
| 650 | 40 | 0.08 | 22.1 | ○ | ◉ |
| 650 | 50 | 0.12 | 22.5 | ◉ | ◉ |
| 650 | 80 | 0.18 | 23.1 | ◉ | ◉ |
| 650 | 120 | 0.25 | 23.6 | ◉ | ◉ |
| 650 | 160 | 0.32 | 24.5 | ◉ | ◉ |
| 650 | 210 | 0.40 | 24.9 | ◉ | ◉ |
| 650 | 260 | 0.48 | 25.2 | ◉ | ◉ |
| 650 | 310 | 0.55 | 25.6 | ◉ | ◉ |
| 650 | 450 | 0.69 | 25.9 | ◉ | ○ |
| 650 | 550 | 0.85 | 25.9 | ◉ | ○ |
| 650 | 580 | 0.89 | 26.2 | ◉ | ○ |
| 650 | 620 | 0.95 | 26.5 | ◉ | X |

X: Defect Rate of 50% or greater
Δ: Defect Rate of 1% to 50%
○: Defect Rate of 0.01% to 1%
◉: Defect Rate less than 0.01%

Referring to Table 5, it can be seen that in the case in which the gap G between the first and second external electrodes satisfied 30 μm≤G≤0.9W, acoustic noise was reduced and reliability was excellent.

It can be seen that in the case in which the gap G between the first and second external electrodes was less than 30 μm, that is, the gap G was 25 μm, the short defect occurred.

Meanwhile, it can be seen that in the case in which the gap G between the first and second external electrodes was greater than 0.9W, that is, the gap G was 0.95W, adhesion strength was low when the multilayer ceramic capacitor was mounted on a board, resulting in a defect.

Board Having Multilayer Ceramic Capacitor Mounted Thereon

Figure 6:
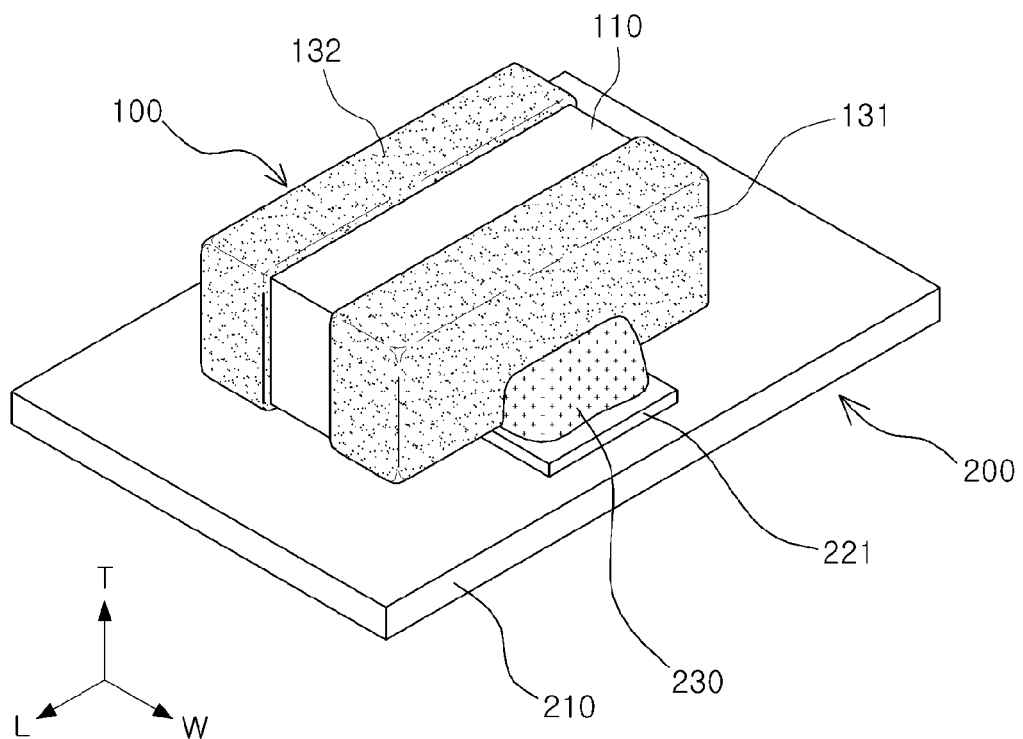
FIG. 6 is a perspective view showing a structure in which the multilayer ceramic capacitor of FIG. 1 is mounted on a printed circuit board.

FIG. 6 is a perspective view showing a structure in which the multilayer ceramic capacitor of FIG. 1 is mounted on a printed circuit board.

Figure 7:
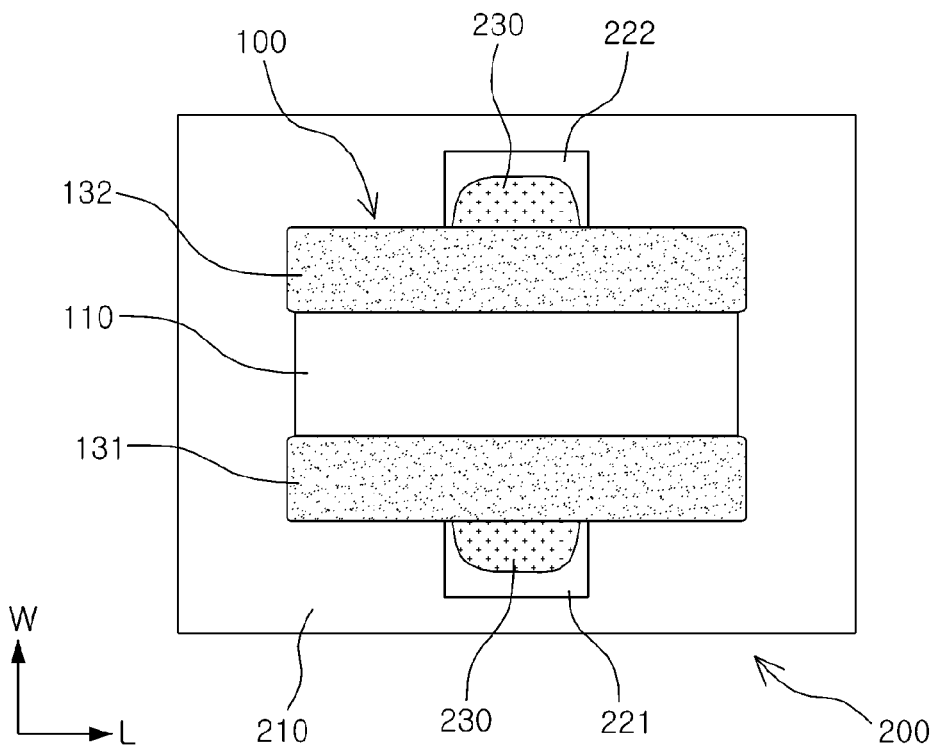
FIG. 7 is a plan view of FIG. 6.

FIG. 7 is a plan view of FIG. 6.

Figure 8:
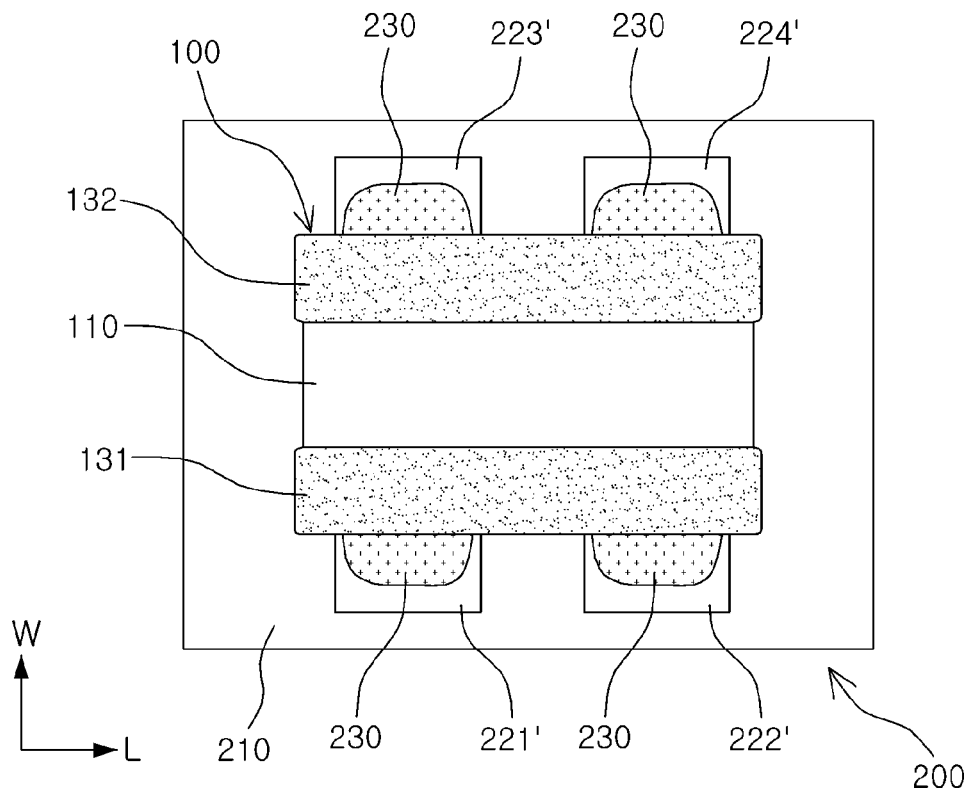
FIG. 8 is a plan view of FIG. 6 according to another exemplary embodiment of the present disclosure.

FIG. 8 is a plan view of FIG. 6 according to another exemplary embodiment of the present disclosure.

Figure 9:
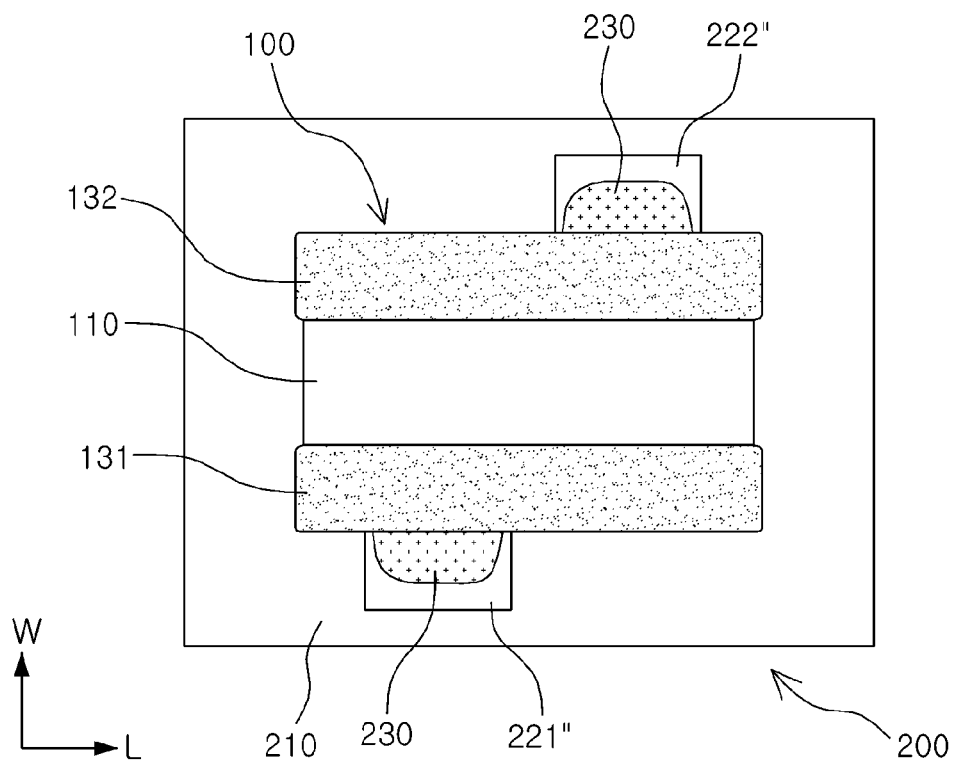
FIG. 9 is a plan view of FIG. 6 according to another exemplary embodiment of the present disclosure.

FIG. 9 is a plan view of FIG. 6 according to another exemplary embodiment of the present disclosure.

Referring to FIGS. 6 and 7, a board 200 having the multilayer ceramic capacitor 100 mounted thereon according to this exemplary embodiment may include a printed circuit board 210 on which the multilayer ceramic capacitor 100 is horizontally mounted, and two or more electrode pads 221 and 222 formed on the printed circuit board 210 to be spaced apart from each other.

The electrode pads may include first and second electrode pads 221 and 222 connected to the first and second external electrodes 131 and 132 of the multilayer ceramic capacitor 100, respectively.

In this case, the multilayer ceramic capacitor 100 may be electrically connected to the printed circuit board 210 by a solder 230 in a state in which the lower cover layer 113 is disposed downwards and the first and second external electrodes 131 and 132 are positioned to contact the first and second electrode pads 221 and 222, respectively.

In the board 200 having the multilayer ceramic capacitor 100 mounted thereon according to another exemplary embodiment of the present disclosure, the solder 230 may be formed on portions of the first and second external electrodes 131 and 132 of the multilayer ceramic capacitor 100, but is not limited thereto.

Particularly, referring to FIGS. 6 and 7, the solder 230 may be disposed around central portions of the first and second external electrodes 131 and 132 of the multilayer ceramic capacitor 100.

When voltage is applied in a state in which the multilayer ceramic capacitor 100 is mounted on the printed circuit board 210 as described above, acoustic noise may be generated.

Here, sizes of the first and second electrode pads 221 and 222 may become an indicator for determining an amount of the solder 230 connecting the first and second external electrodes 131 and 132 of the multilayer ceramic capacitor 100 to the first and second electrode pads 221 and 222, and a level of the acoustic noise may be controlled according to the amount of the solder 230.

When voltages having different polarities are applied to the first and second external electrodes 131 and 132 formed on both side surfaces of the multilayer ceramic capacitor 100 in a state in which the multilayer ceramic capacitor 100 is mounted on the printed circuit board 210, the ceramic body 110 may be expanded and contracted in a thickness direction by an inverse piezoelectric effect of the dielectric layers 111, and both side portions of the ceramic body 110 having the first and second external electrodes 131 and 132 formed thereon may be contracted and expanded by a poisson effect as opposed to the expansion and contraction of the ceramic body 110 in the thickness direction.

More specifically, the contraction and expansion of the ceramic body may occur with a displacement of about 20 nm in the thickness direction of the multilayer ceramic capacitor, a displacement of about 4 nm in the length direction thereof, and a displacement of about 2 nm in the width direction thereof.

Here, in the multilayer ceramic capacitor according to the exemplary embodiment of the present disclosure, since the first and second external electrodes are formed on both side surfaces of the ceramic body in the width direction of the multilayer ceramic capacitor, displacement in contraction and expansion may be significantly decreased, whereby acoustic noise may be reduced.

Referring to FIG. 8, in another exemplary embodiment of the present disclosure, the electrode pads may include first and second electrode pads 221' and 222' connected to the first external electrode 131 of the multilayer ceramic capacitor 100 and third and fourth electrode pads 223' and 224' connected to the second external electrode 132.

According to the exemplary embodiment of the present disclosure shown in FIG. 8, two electrode pads for the same external electrode are spaced apart from each other, so that a difference in displacement of contraction and expansion may be decreased, whereby an effect of reducing acoustic noise may be further excellent.

Referring to FIG. 9, according to another exemplary embodiment of the present disclosure, first and second electrode pads 221" and 222" may be offset to each other in the width direction of the multilayer ceramic capacitor.

According to the exemplary embodiment of the present disclosure shown in FIG. 9, since the first and second electrode pads 221" and 222" may be offset to each other in the width direction of the multilayer ceramic capacitor, contraction and expansion may be offset to each other, such that an effect of reducing acoustic noise may be further excellent.

As set forth above, according to exemplary embodiments of the present disclosure, since a gap between external electrodes is relatively short, an amount of vibrations generated in a multilayer ceramic capacitor transferred to a board may be reduced, whereby acoustic noise may be reduced.

Further, when the multilayer ceramic capacitor is mounted on the board, a mounting area may be reduced.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor, comprising:
    a ceramic body including dielectric layers and having first and second main surfaces opposing each other, first and second side surfaces opposing each other, and first and second end surfaces opposing each other;
    an active layer including a plurality of first and second internal electrodes disposed to face each other with at least one of the dielectric layers interposed therebetween and alternately exposed to the first or second side surface;
    upper and lower cover layers disposed on and below the active layer, respectively; and
    a first external electrode disposed on the first side surface of the ceramic body and electrically connected to the first internal electrodes and a second external electrode disposed on the second side surface and electrically connected to the second internal electrodes,
    wherein when a thickness of the ceramic body is defined as T and a width thereof is defined as W, $0.75W \leq T \leq 1.25W$ is satisfied,
    when a gap between the first and second external electrodes is defined as G, $30\ \mu m \leq G \leq 0.9W$ is satisfied, and
    an average number of dielectric grains in a single dielectric layer in a thickness direction thereof is 2 or greater.

2. The multilayer ceramic capacitor of claim 1, wherein the lower cover layer has a thickness of 10 μm to 100 μm.

3. The multilayer ceramic capacitor of claim 1, wherein when the thickness of the ceramic body is a distance between the first and second main surfaces, the width of the ceramic body is a distance between the first side surface on which the first external electrode is formed and the second side surface on which the second external electrode is formed, and a length of the ceramic body is a distance between the first and second end surfaces, the distance between the first and second side surfaces is shorter than or equal to the distance between the first and second end surfaces.

4. The multilayer ceramic capacitor of claim 3, wherein when the length and the width of the ceramic body are defined as L and W, respectively, $0.5L \leq W \leq L$ is satisfied.

5. The multilayer ceramic capacitor of claim 1, wherein an average grain size of the dielectric grains is 50 nm to 500 nm.

6. The multilayer ceramic capacitor of claim 1, wherein the first and second internal electrodes are spaced apart from the first and second end surfaces of the ceramic body by a predetermined distance.

7. The multilayer ceramic capacitor of claim 1, wherein the first and second external electrodes are extended to portions of the first and second main surfaces of the ceramic body.

8. A board having a multilayer ceramic capacitor mounted thereon, the board comprising:
    a printed circuit board having two or more electrode pads formed thereon;
    the multilayer ceramic capacitor mounted on the printed circuit board; and
    a solder connecting the electrode pads and the multilayer ceramic capacitor,
    wherein the multilayer ceramic capacitor includes:
    ceramic body including dielectric layers and having first and second main surfaces opposing each other, first and second side surfaces opposing each other, and first and second end surfaces opposing each other;
    an active layer including a plurality of first and second internal electrodes disposed to face each other with at least one of the dielectric layers interposed therebetween and alternately exposed to the first or second side surface;
    upper and lower cover layers disposed on and below the active layer, respectively; and
    a first external electrode disposed on the first side surface of the ceramic body and electrically connected to the first internal electrode and a second external electrode disposed on the second side surface and electrically connected to the second internal electrode,
    when a thickness of the ceramic body is defined as T and a width thereof is defined as W, $0.75W \leq T \leq 1.25W$ is satisfied,
    when a gap between the first and second external electrodes is defined as G, $30\ \mu m \leq G \leq 0.9W$ is satisfied, and
    an average number of dielectric grains in a single dielectric layer in a thickness direction thereof is 2 or greater.

9. The board of claim 8, wherein the lower cover layer has a thickness of 10 μm to 100 μm.

10. The board of claim 8, wherein when the thickness of the ceramic body is a distance between the first and second main surfaces, the width of the ceramic body is a distance between the first side surface on which the first external electrode is formed and the second side surface on which the second external electrode is formed, and a length of the ceramic body is a distance between the first and second end surfaces, the distance between the first and second side surfaces is shorter than or equal to the distance between the first and second end surfaces.

11. The board of claim 10, wherein when the length and the width of the ceramic body are defined as L and W, respectively, $0.5L \leq W \leq L$ is satisfied.

12. The board of claim 8, wherein an average grain size of the dielectric grains is 50 nm to 500 nm.

13. The board of claim 8, wherein the first and second internal electrodes are spaced apart from the first and second end surfaces of the ceramic body by a predetermined distance.

14. The board of claim 8, wherein the first and second external electrodes are extended to portions of the first and second main surfaces of the ceramic body.

15. The board of claim 8, wherein the solder is disposed around portions of the first and second external electrodes of the multilayer ceramic capacitor.

16. The board of claim 8, wherein the solder is disposed around central portions of the first and second external electrodes of the multilayer ceramic capacitor.

17. The board of claim 8, wherein the electrode pads include first and second electrode pads connected to the first and second external electrodes of the multilayer ceramic capacitor, respectively.

18. The board of claim 17, wherein the first and second electrode pads are offset to each other in a width direction of the multilayer ceramic capacitor.

19. The board of claim 8, wherein the electrode pads include:
   first and second electrode pads connected to the first external electrode of the multilayer ceramic capacitor; and
   third and fourth electrode pads connected to the second external electrode of the multilayer ceramic capacitor.

* * * * *